United States Patent
Fugere et al.

[11] Patent Number: 6,119,895
[45] Date of Patent: Sep. 19, 2000

[54] METHOD AND APPARATUS FOR DISPENSING MATERIALS IN A VACUUM

[75] Inventors: Jeffrey P. Fugere, Sandown; Thomas Nowak, Jr., Hampton, both of N.H.; Francis M. Beals, Salisbury, Mass.

[73] Assignee: Speedline Technologies, Inc., Franklin, Mass.

[21] Appl. No.: 09/168,536

[22] Filed: Oct. 8, 1998

Related U.S. Application Data

[60] Provisional application No. 60/062,027, Oct. 10, 1997, abandoned.

[51] Int. Cl.[7] ..................................................... G01F 11/00
[52] U.S. Cl. .............................. 222/1; 222/152; 222/333; 222/415
[58] Field of Search ................................. 222/1, 152, 333, 222/413, 415

[56] References Cited

U.S. PATENT DOCUMENTS

| | | | |
|---|---|---|---|
| 3,946,907 | 3/1976 | Berve | 222/152 |
| 4,593,835 | 6/1986 | Kikkawa et al. | 222/152 |
| 5,203,076 | 4/1993 | Banerji et al. | 29/840 |
| 5,480,487 | 1/1996 | Figini et al. | 222/152 |
| 5,819,983 | 10/1998 | White et al. | 222/1 |

FOREIGN PATENT DOCUMENTS 0460621  4/1991  European Pat. Off. .

OTHER PUBLICATIONS

International Search Report, PCT/US98/21415, dated Jan. 25, 1999.

Patent Abstracts of Japan, vol. 010, No. 293 (E–443), Apr. 10, 1986 & JP 61 110438A (Matsushita Electric Works Ltd.), May 28, 1986.

Patent Abstracts of Japan, vol. 014, No. 268 (E–0939), Jun. 11, 1990 & JP 02 083916A (NEC Corp.), Mar. 2, 1990.

Primary Examiner—Joseph A. Kaufman
Attorney, Agent, or Firm—Mintz, Levin, Ferris, Glovsky and Popeo, P.C.

[57] ABSTRACT

The present invention provides a method and apparatus for dispensing materials onto a substrate in a vacuum. In one embodiment, a dispensing system includes a dispensing vacuum chamber having an inlet to receive substrates for dispensing and an outlet to provide substrates having material dispensed thereon, a dispensing pump, disposed within the dispensing vacuum chamber, that dispenses the material onto substrates, a substrate support system, disposed within the dispensing vacuum chamber, that supports substrates at a dispensing position beneath the dispensing pump, an inlet vacuum chamber coupled to the inlet of the dispensing vacuum chamber, and an outlet vacuum chamber coupled to the outlet of the dispensing vacuum chamber.

20 Claims, 7 Drawing Sheets

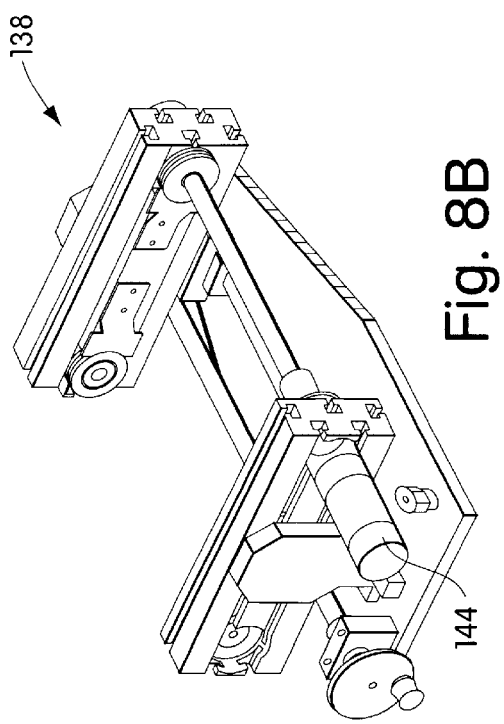
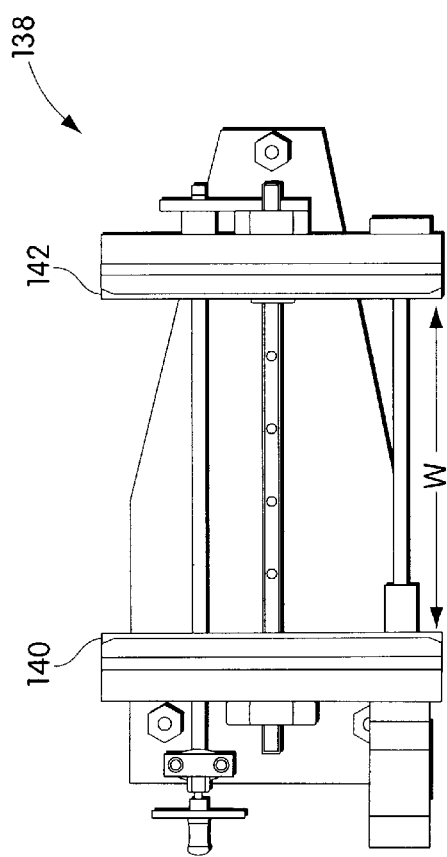
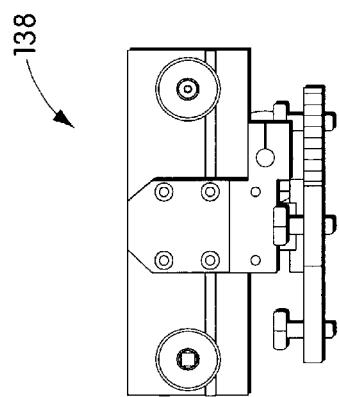
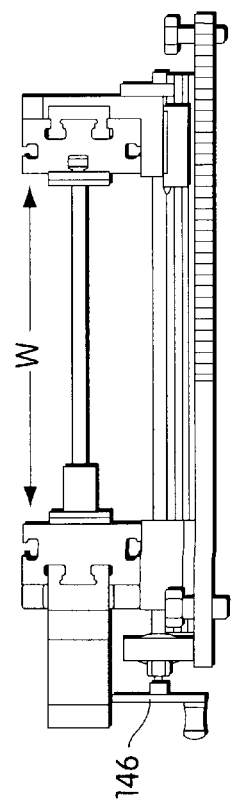
Fig. 8B
Fig. 8D
Fig. 8A
Fig. 8C

METHOD AND APPARATUS FOR DISPENSING MATERIALS IN A VACUUM

RELATED APPLICATION

This application claims priority from U.S. Provisional Application Ser. No. 60/062,027, filed Oct. 10, 1997 now abandoned, which is incorporated by reference herein.

FIELD OF THE INVENTION

The present invention relates to an apparatus and process for depositing underfill material on electronic parts, and more specifically to an apparatus and process which uses changes in air pressure to force material under an electronic integrated circuit chip.

BACKGROUND OF THE INVENTION

The need for denser, larger and more durable chip assemblies has broadened the use of Direct Chip Attach (DCA) technology to include flip chip integrated circuits. A typical flip chip integrated circuit utilizes a solder ball grid array to provide electrical connections between a die of the flip chip and a substrate. During manufacturing of a typical flip chip, after the flip chip is assembled on a substrate, a liquid dispensing system is used to apply an underfill encapsulant material between the die and the substrate. The flip chip underfill material is used to reduce mechanical and thermal stress on the electrical connections and to protect the electrical connections against atmospheric conditions. The underfill material provides stability and rigidity to the assembled flip chip and may also be used as a heat conductor to improve thermal performance of the flip chip.

In typical prior art flip chip underfilling processes, a dispenser system is used to dispense underfill material around the sides of the flip chip and the underfill material spreads under the flip chip and around the solder balls of the grid array via capillary action or "wicking". During the assembly process, the substrate is typically heated prior to, during, and after dispensing of the underfill material to a temperature ranging from ambient conditions to approximately 120° C. The heating of the substrate increases the capillary action causing the underfill material to flow further under the die of the flip chip. A final fillet of underfill material is applied around the sides of the flip chip after the wicking action has occurred.

A drawback associated with underfilling processes is that the underfill material may not completely fill all voids between a die and a substrate in a flip chip. The result of this problem can be seen in FIG. 1, which shows a cross-sectional view of a flip chip die 10 connected to a substrate 12 through a number of solder ball connections 14. In FIG. 1 underfill material 16 has been applied around the edges of the substrate and die and the underfill material has partially filled the area between the die 10 and the substrate 12 leaving a void 18 containing no underfill material. The void 18 may affect the performance and stability of the flip chip, and thus, flip chips like that shown in FIG. 1 having voids are typically rejected by manufacturers resulting in many wasted parts. Defective chips having voids which escape detection are more likely to exhibit operational failures during use.

To overcome the problem of voids or air gaps, one prior art dispensing system developed by Tessera of San Jose, Calif. utilizes a vacuum approach to completely underfill flip chips. In this prior art system, the dispensing system, including one or more flip chips that are to receive underfill material, is enclosed within an air tight chamber, and prior to the dispensing of underfill material, a vacuum pump is used to purge all air from the chamber to create a vacuum. The underfill material is then dispensed around all sides of the flip chips, and the chamber is returned to ambient pressure. When the chamber is returned to ambient air pressure, the underfill material is forced under the flip chips by the difference in air pressure outside the flip chips and under the flip chips.

While the above described prior art system is effective in preventing voids in underfill material in flip chips, the system is relatively large and the time required to purge air from the air tight chamber is rather long. Further, because the air tight chamber is so large, it is difficult to effectively purge air from the chamber. In addition, the air tight chamber of the prior art accommodates only manual loading of the flip chips into the chamber, preventing the dispensing system contained within the chamber from being effectively used in an automated assembly line.

SUMMARY OF THE INVENTION

The present invention overcomes disadvantages of the prior art by providing an improved apparatus and process for underfilling flip chips using dispensing systems having vacuum chambers that overcome drawbacks of the prior art systems.

In a first embodiment of the present invention, a dispensing system for dispensing material onto a substrate in a vacuum is provided. The vacuum chamber has first and second interlock chambers for allowing workpieces to be moved in and out of the vacuum chamber while the vacuum chamber is maintained at a prescribed vacuum level.

In one version of the first embodiment, the workpieces are moved in and out of the vacuum chamber under control of the dispensing system using a conveyor system. In another version, the workpieces are transported using a continuous tape system.

BRIEF DESCRIPTION OF THE DRAWINGS

For a better understanding of the present invention, reference is made to the drawings which are incorporated herein by reference and in which:

FIGS. 8A–8D illustrate a conveyor used in embodiments of the invention; and

DETAILED DESCRIPTION

Figure 1:
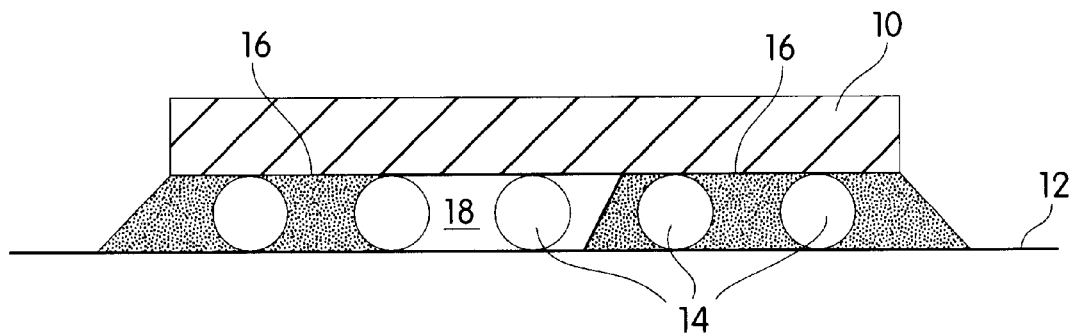
FIG. 1 illustrates a flip chip integrated circuit with an inadequate underfill which leaves a void beneath the flip chip.
Figure 2:
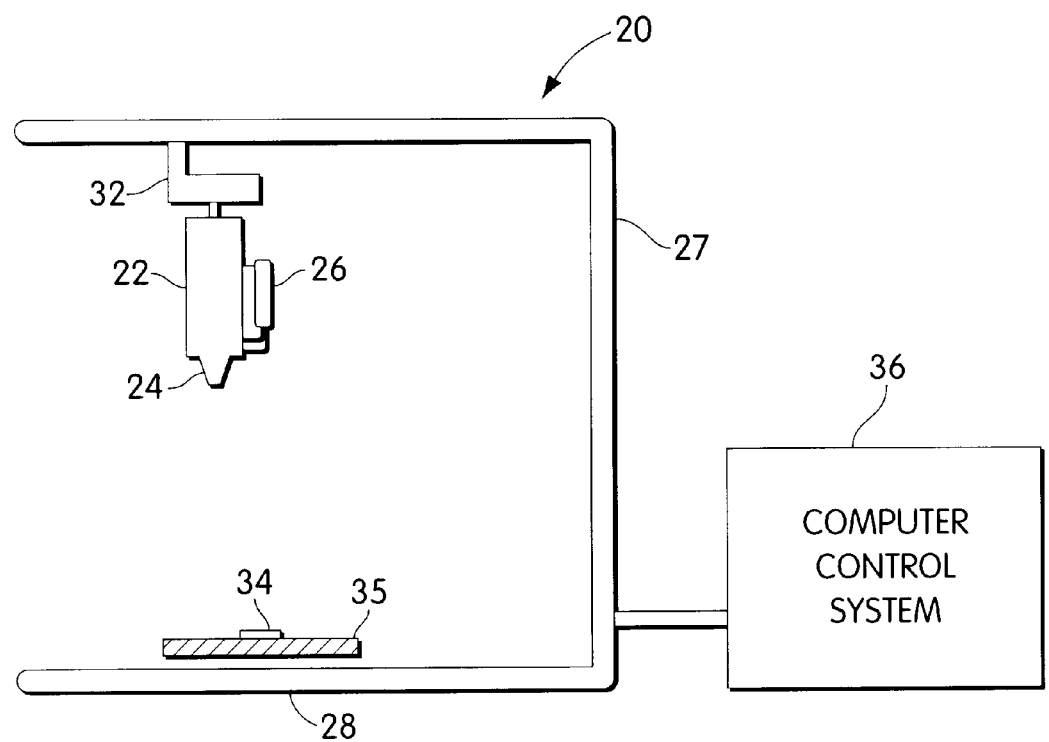
FIG. 2 illustrates a dispenser system.
Figure 3:
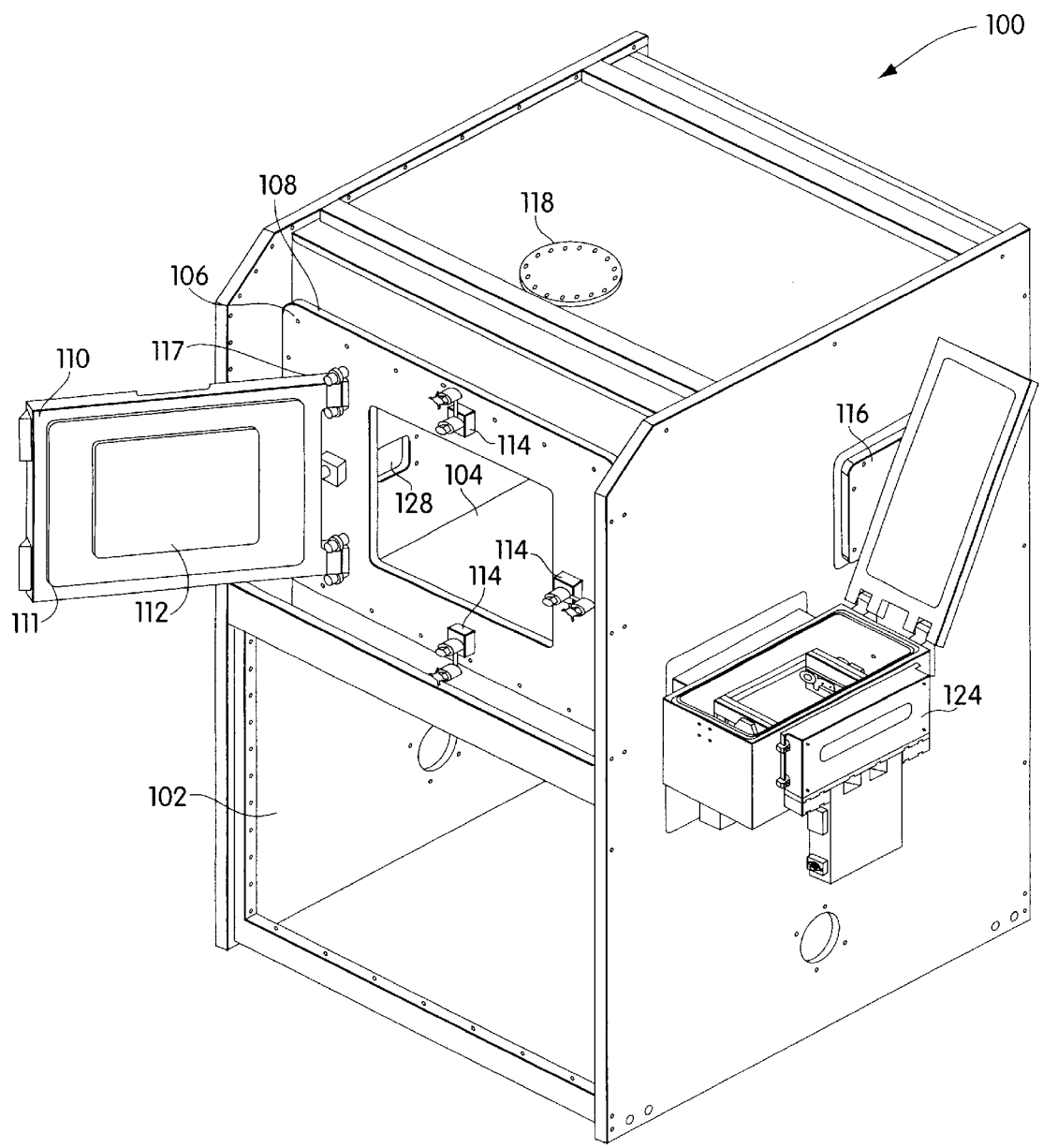
FIG. 3 is a perspective view of a vacuum chamber in accordance with one embodiment of the present invention.

For purposes of illustration, embodiments of the present invention will now be described with reference to a dispensing system used to dispense underfill material beneath flip chip integrated circuits. One skilled in the art will appreciate, however, that embodiments of the present invention are not limited to dispensing underfill materials for flip chip integrated circuits, but may be used in other applications. FIG. 2 shows a typical dispensing system 20 for dispensing underfill material along the sides of a flip chip integrated circuit 34 contained within a carrier 35. The dispensing system 20 includes a pump 22 having a nozzle 24 for dispensing encapsulant material, a syringe 26 filled with encapsulant material to be provided to the pump 22, a frame 27, and a base 28 upon which the carrier 35 is placed. The pump is mounted to an X-Y gantry system 32 that, under the control of the dispensing system, moves the pump to different positions above the base 28. The X-Y gantry system may also be moved in a vertical Z direction to allow the pump to be lowered to a proper height above the base for dispensing. The dispensing system also includes a computer control system 36 that controls operation of the dispensing system. The pump may be implemented using an auger pump such as that described in patent application Ser. No. 08/562,068 entitled "Liquid Dispensing System With Improved Sealing Auguring Screw and Method for Dispensing," assigned to the assignee of the present invention, and incorporated herein by reference.

Integrated circuits or other substrates that are to receive dispensing material are typically transported as individual units on conveyors, multiple units in a common carrier, or using a continuous tape feeder system. The dispensing system 20 may include a conveyor for loading and unloading integrated circuits or multiple unit common carriers into the dispensing system. Alternatively, the dispensing system 20 may be configured as known in the art for receiving a continuous tape having integrated circuits that are to receive encapsulent material bonded to the top surface of the tape.

A first embodiment of a vacuum chamber 100 for a dispensing system, such as dispensing system 20, in accordance with the present invention will now be described with reference to FIGS. 3–9. The vacuum chamber 100 is constructed primarily of stainless steel and includes a lower compartment 102 and an upper air-tight upper compartment 104 that can be maintained at a vacuum to a level of at least 28 inches of mercury or higher. The upper compartment 104 is sized to accommodate the components of the dispensing system 20 shown in FIG. 2, with the exception of the computer control system 36. The lower compartment 102 is open to the atmosphere and is used to contain vacuum pumps, power circuitry, control electronics and control pneumatics for the dispensing system contained within the upper compartment 104. In one embodiment, the control electronics includes the computer control system 36, and the computer control system includes a Pentium processor, programmed to control the dispensing system and to control the flow of workpieces such as integrated circuits into and out of the dispensing system.

The upper compartment has a front panel 106 that is secured to the chamber using a number of screws 108. An O-ring vacuum seal gasket (not shown), is mounted at the interface between the chamber and the front panel 106 to maintain an air-tight seal.

Incorporated within the front panel 106 is an access door 110 that is coupled to the front panel using hinges 117 and latches 114 for securely latching the door 110 to maintain an air-tight seal. The door also includes an O-ring vacuum seal gasket 111 and a viewing window 112 to allow an operator to view a dispensing system contained within the chamber.

In addition to the access door 110, there are a number of other access panels that allow an operator to access the dispensing system for maintenance, to add dispensing material, or for any other reason. These access panels include side access panels 116, a top access panel 118, and a back access panel 120. Each of these access panels are secured to the chamber using a number of screws and a gasket, similar to gasket 111, mounted on the interface between the access panels and the chamber. Communication between the dispensing system in the upper chamber and the control and power electronics in the lower chamber is accomplished using a number of cables that penetrate the bottom of the upper chamber using bulkhead mounted, vacuum rated connectors that maintain the air-tight seal of the upper chamber. Alternatively, the cables could penetrate the back or sides of the upper chamber.

A slot is provided on the left side and the right side of the upper compartment 104 to allow workpieces to be loaded into and unloaded from the upper compartment 104. Only the slot 128 on the left side is shown in the drawings, however, the slot 128 on the right side is substantially identical to the slot on the left side. The size of the slots are determined by the size of the integrated circuits, multiple unit common carriers or continuous tape that is loaded into a dispensing system confined within the vacuum chamber. Attached respectively to the left side and the right side of the vacuum chamber 100 at the slots 128 are an inlet interlock chamber 122 and an outlet interlock chamber 124.

Figure 4:
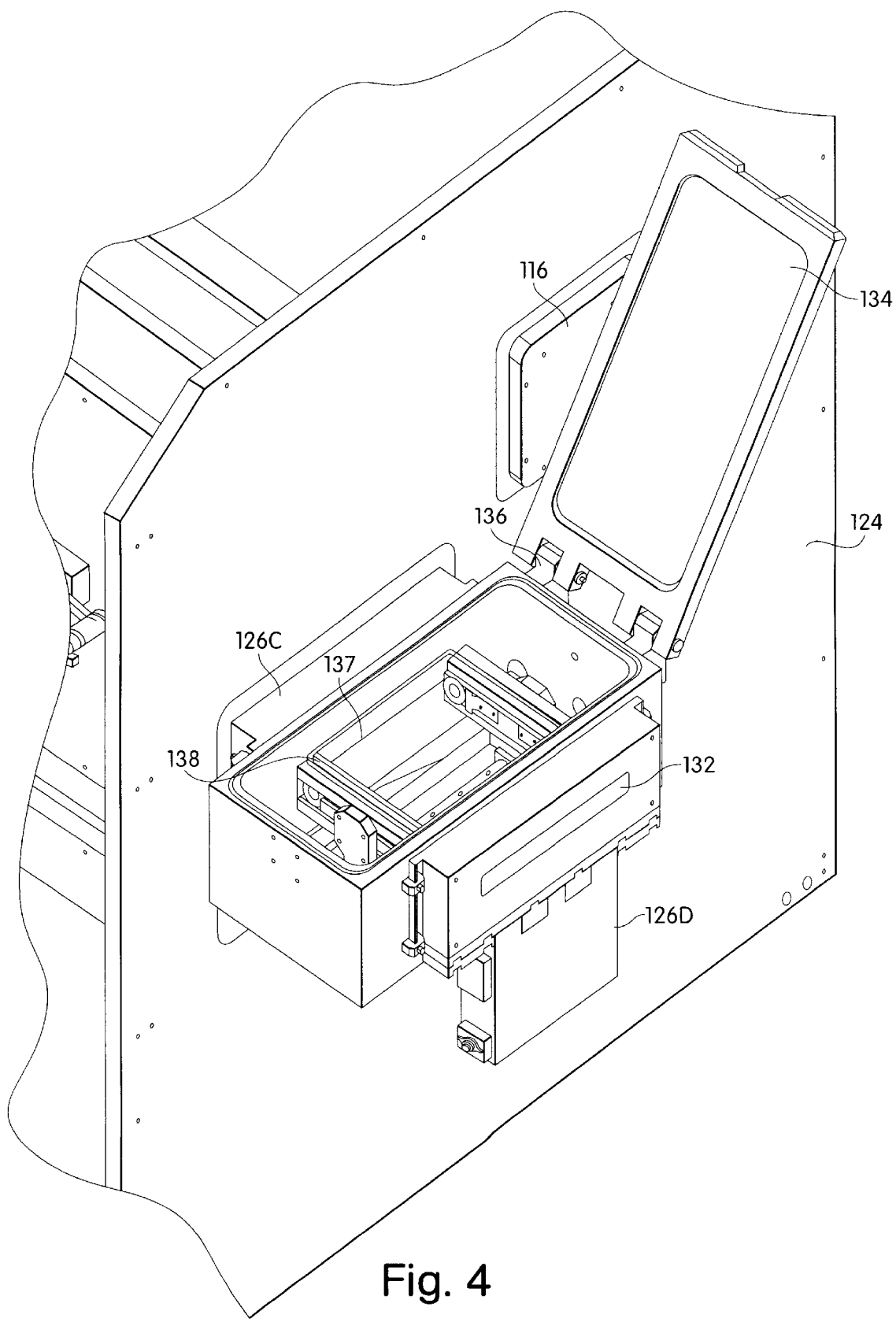
FIG. 4 is an enlarged partial side view of the vacuum chamber of FIG. 3.
Figure 5:
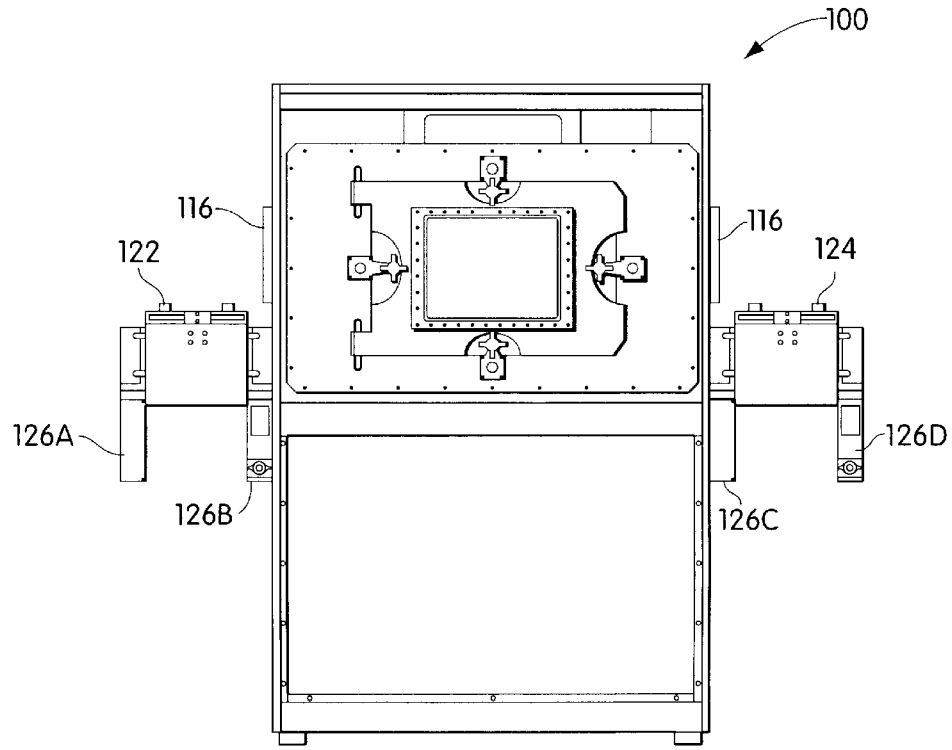
FIG. 5 is a front view of the vacuum chamber of FIG. 3.
Figure 6:
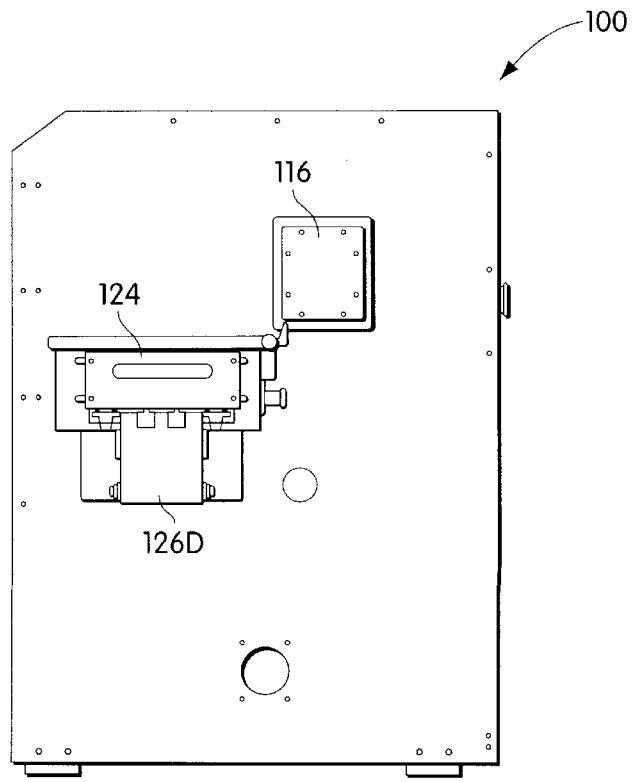
FIG. 6 is a side view of the vacuum chamber of FIG. 3.
Figure 7:
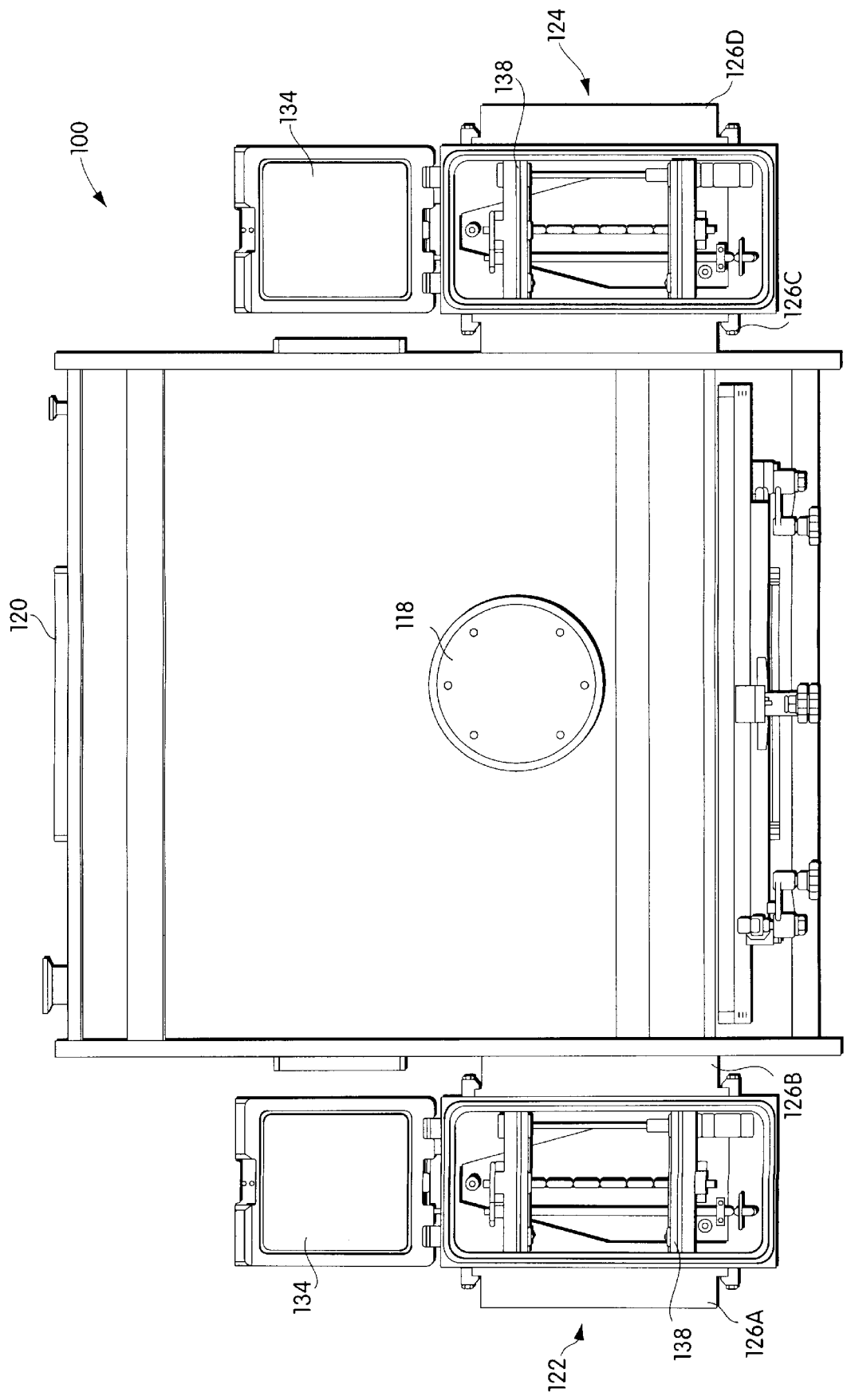
FIG. 7 is a top view of the vacuum chamber of FIG. 3.

Outlet interlock chamber 124 will be described in detail using FIG. 4, it being understood that inlet interlock chamber 122 is substantially identical to the outlet interlock chamber. In one embodiment, the outlet interlock chamber and the inlet interlock chamber are made from a solid billet of aluminum. Alternatively, the interlock chambers could be made using an aluminum cast or may be made from some other material. The outlet interlock chamber has an inlet slot and an outlet slot 132, each of approximately the same size as the slots 128 in the upper compartment 104. Only the outlet slot 132 is visible in FIG. 4. At each of the inlet and outlet slots of the interlock chambers 122, 124 there is a pneumatic door assembly 126A–126D for providing an air-tight seal over the inlet slot and the outlet slot 132. Each of the pneumatic door assemblies is coupled to the pneumatic controller in the lower compartment, to control opening and closing of the doors. In one embodiment of the present invention, a Series 02 door assembly manufactured by VAT of Woburn, Mass. is used for each of the door assemblies 126A–126D.

The outlet interlock chamber 124 also includes a top access door 134 coupled to the interlock chamber using two hinges 136 and a latch (not shown). A gasket 137, similar to gasket 111, is positioned on the top of the interlock chamber to provide an air tight seal when the top door is closed.

With both pneumatic door assemblies and the top access door in the closed position, the outlet interlock chamber 124 is an air-tight chamber. Each of the inlet and outlet interlock chambers is coupled to a vacuum pump system located in the lower compartment 102 to allow the inlet and outlet interlock chambers to be evacuated to a vacuum level of 28 inches of mercury or greater.

Each of the interlock chambers has an adjustable conveyor 138 that is used to move workpieces in and out of the vacuum chamber 100. FIGS. 8A–8D show the conveyor 138 in greater detail. The conveyor includes two motorized belts or rails 140 and 142 controlled by a motor 144. The motor is controlled by the processor located in the lower compartment 102. The width W of the conveyor can be manually adjusted using handle 146 to accommodate different size workpieces.

Figure 9:
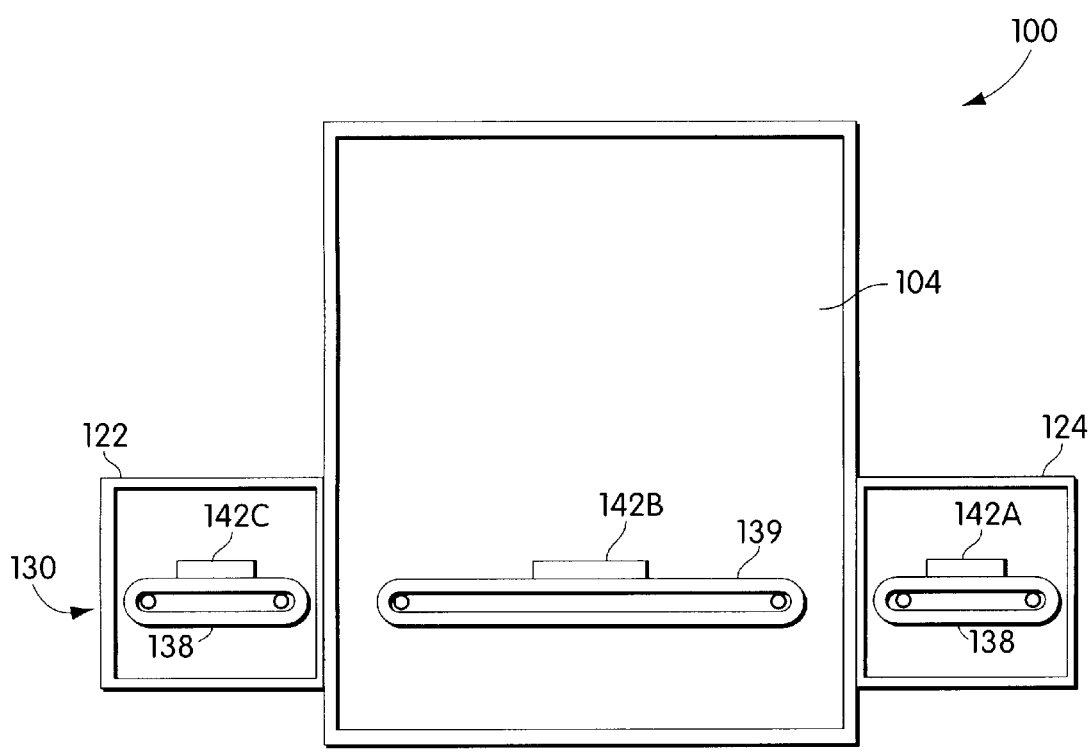
FIG. 9 illustrates the movement of workpieces in the vacuum chamber of FIG. 3.

In one embodiment of the present invention, the dispensing system contained within the vacuum chamber 100 uses a conveyor 139 to transport workpieces into and out of the vacuum chamber. Each of the conveyors 138 in the interlock chambers is aligned with the conveyor 139 of the dispensing system. FIG. 9 shows a cross-sectional view of the upper compartment 104 and the interlock chambers 122 and 124 with the conveyor 140 system within the upper compartment 104. Components of the dispensing system, other than the conveyor, are not shown in FIG. 9, for clarity. Also, the pneumatic doors 126A–126D are not shown in FIG. 9. Workpieces 142A, 142B and 142C are shown in FIG. 9 on the conveyors.

In one embodiment of the present invention all motors contained within the upper compartment 104 and within the interlock chambers are of the brushless type to prevent arcing, which could occur in a brush-type motor, when air is evacuated from the chambers.

The operation of a dispensing system within the vacuum chamber 100 to dispense encapsulant material onto a workpiece in a vacuum will now be described. In an initial step of the operation, air is drawn from the upper compartment and the outlet interlock chamber using the vacuum pumps until the vacuum level is at approximately 28 inches of mercury. A first workpiece 142A is then loaded through the inlet slot 130 into the inlet interlock chamber 122. As the workpiece enters the inlet slot 130, the conveyor 138 in the inlet interlock chamber is activated to draw the workpiece into the interlock chamber. The pneumatic door 126A at the inlet slot 130 is then closed (pneumatic door 126B at the outlet slot 132 of the inlet interlock chamber is also in the closed position). Next, air is drawn from the inlet interlock chamber using one of the vacuum pumps until the vacuum level within the inlet interlock chamber is at approximately 28 inches of mercury. The pneumatic door 126B at the outlet slot 132 of the inlet interlock chamber is then opened, and conveyor 138 in the inlet interlock chamber and conveyor 140 in the upper compartment 104 are used to move the workpiece 142A from the interlock chamber to the dispensing location in the upper compartment.

Material is then dispensed onto the workpiece 142B. While material is being dispensed onto the workpiece, the inlet interlock chamber is slowly vented to atmosphere, the pneumatic door 126A at the inlet slot 130 is opened, a new workpiece 142B is conveyed into the inlet interlock chamber, the pneumatic door 126A is closed and air is evacuated from the inlet interlock chamber.

After the material has been dispensed, and a new workpiece has been loaded into the inlet interlock chamber, pneumatic doors 126B and 126C are opened, and all three conveyors are activated. Workpiece 142A then enters the outlet interlock chamber, pneumatic door 126C is closed, and workpiece 142B is moved to the dispensing position. While material is dispensed onto workpiece 142B, workpiece 142C enters the inlet interlock chamber in the same manner as workpiece 142B described above. At this point in the dispensing cycle, workpieces 142A, 142B and 142C are in the positions shown in FIG. 9. Also, while material is dispensed onto workpiece 142B, the outlet interlock chamber is slowly vented to atmosphere, pneumatic door 126D is opened, and workpiece 142A is removed. Pneumatic door 126D is then closed and the air is evacuated from the outlet interlock chamber. The cycle described above is repeated to dispense material onto additional workpieces.

The operation described above is coordinated by the computer control system located in the lower compartment of the vacuum chamber. The workpieces may be loaded into the inlet interlock chamber and unloaded from the outlet interlock chamber manually, or they may be loaded automatically using, for example, automatic magazine loaders/unloaders, such as those available from Camelot Systems, Inc., Haverhill, Mass. The workpieces may also be loaded automatically using external conveyors when the dispensing system is part of an in-line system. When the workpieces are loaded automatically, the computer control system may be used to control the magazine loaders and unloaders.

In the embodiments of the invention described above, the dispensing system and inlet and outlet interlock chambers are described as having conveyors for moving material into and out of the interlock chamber and the vacuum chambers. As understood by those skilled in the art, the conveyors could readily be replaced by a system that is adapted to accommodate a continuous tape. When continuous tape is used, the pneumatic doors must be modified to allow the continuous tape to pass through the doors while maintaining an air seal around the continuous tape.

Using the process and apparatus described above, encapsulant materials can be dispensed in a vacuum onto workpieces, such as integrated circuits, without the drawbacks of the prior art systems. Specifically, by using an inlet interlock chamber and outlet interlock chambers, as described above, there is no need to vent and evacuate the complete dispensing chamber, as in prior art systems. Further, embodiments of the present invention are readily adaptable for in-line use in automated assembly line.

In embodiments described above, the dispensing of material is described as occurring in a vacuum. As understood by those skilled in the art, the term vacuum is used herein to describe an atmospheric pressure lower than an ambient atmospheric pressure, and not necessarily a complete vacuum.

In embodiments of the present invention that use a syringe to contain material for dispensing, the syringe maybe located either inside or outside the vacuum chamber.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A dispensing system for dispensing material onto a substrate, the dispensing system comprising:

a dispensing vacuum chamber having an inlet to receive substrates for dispensing and an outlet to provide substrates having material dispensed thereon;

a dispensing pump, disposed within the dispensing vacuum chamber that dispenses the material onto substrates;

a gantry system disposed within the dispensing vacuum chamber and coupled to the dispensing pump to provide movement of the pump along three orthogonal axes;

a substrate support system, disposed within the dispensing vacuum chamber, that supports substrates at a dispensing position beneath the dispensing pump;

an inlet vacuum chamber coupled to the inlet of the dispensing vacuum chamber; and an outlet vacuum chamber coupled to the outlet of the dispensing vacuum chamber.

2. The dispensing system of claim 1, further comprising a vacuum pump system coupled to the dispensing vacuum chamber, the inlet vacuum chamber and the outlet vacuum chamber.

3. The dispensing system of claim 2, wherein the substrate support system includes a first conveyor to transport substrates from the inlet of the dispensing vacuum chamber to the dispensing position and from the dispensing position to the outlet of the dispensing vacuum chamber.

4. The dispensing system of claim 3, wherein the inlet vacuum chamber includes an inlet to receive substrates and a second conveyor system, disposed within the inlet vacuum chamber, to transfer substrates from the inlet of the inlet vacuum chamber to the inlet of the dispensing vacuum chamber.

5. The dispensing system of claim 4, wherein the outlet vacuum chamber includes an outlet to provide substrates having material dispensed thereon, and further includes a third conveyor system, disposed within the outlet vacuum chamber, to transfer substrates from the outlet of the dispensing vacuum chamber to the outlet of the outlet vacuum chamber.

6. The dispensing system of claim 5, further comprising a controller, coupled to the vacuum pump system, to control the vacuum pump system to evacuate air from the dispensing vacuum chamber, the inlet vacuum chamber and the outlet vacuum chamber.

7. The dispensing system of claim 6, further comprising:
a first door positionable over the inlet of the inlet vacuum chamber to provide a substantially air tight seal;
a second door positionable over the inlet of the dispensing vacuum chamber to provide a substantially air tight seal;
a third door positionable over the outlet of the dispensing vacuum chamber to provide a substantially air tight seal;
a fourth door coupled to the outlet vacuum chamber and positionable over the outlet of the outlet vacuum chamber to provide a substantially air tight seal.

8. The dispensing system of claim 7, wherein the controller is coupled to the first door, the second door, the third door and the fourth door to control movement of each of the doors, wherein the controller is coupled to the first conveyor system, the second conveyor system and the third conveyor system to control movement of each of the conveyor systems, and wherein the controller is coupled to the dispensing pump to control dispensing of material from the pump.

9. The dispensing system of claim 2, further comprising a controller, coupled to the vacuum pump system, to control the vacuum pump system to evacuate air from the dispensing vacuum chamber, the inlet vacuum chamber and the outlet vacuum chamber.

10. A method for dispensing material onto a substrate comprising steps of:
loading the substrate into a first vacuum chamber;
evacuating air from the first vacuum chamber;
evacuating air from a second vacuum chamber, coupled to the first vacuum chamber, containing a dispensing pump mounted to a gantry system capable of moving the pump along three orthogonal axes;
loading the substrate into the second vacuum chamber;
dispensing the material onto the substrate using the dispensing pump while moving the pump along at least one of the three orthogonal axes;
evacuating air from a third vacuum chamber coupled to the second vacuum chamber; and
loading the substrate into the third vacuum chamber.

11. The method of claim 10, wherein the step of loading the substrate into the second vacuum chamber includes a step of transferring the substrate from a first conveyor system disposed in the first vacuum chamber to a second conveyor system disposed in the second vacuum chamber.

12. The method of claim 11, wherein the step of loading the substrate into the third vacuum chamber includes a step of transferring the substrate from the second conveyor system to a third conveyor disposed in the third vacuum chamber.

13. The method of claim 11, wherein the substrate includes a flip chip, and the step of dispensing includes a step of dispensing an underfill material on the substrate around the flip chip.

14. The method of claim 13, wherein the step of dispensing occurs after the step of evacuating the second chamber such that the second chamber is substantially void of air when the step of dispensing occurs.

15. The method of claim 10, wherein the substrate includes a flip chip, and the step of dispensing includes a step of dispensing an underfill material on the substrate around the flip chip.

16. The method of claim 10, wherein the step of dispensing occurs after the step of evacuating the second chamber such that the second chamber is substantially void of air when the step of dispensing occurs.

17. A dispensing system for dispensing material onto a substrate, the dispensing system comprising:
a dispensing vacuum chamber having an inlet to receive substrates for dispensing and an outlet to provide substrates having material dispensed thereon;
a dispensing pump, disposed within the dispensing vacuum chamber that dispenses the material onto substrates;
a gantry system disposed within the dispensing vacuum chamber and coupled to the dispensing pump to provide movement of the pump along three orthogonal axes;
means for evacuating air from the dispensing vacuum chamber to provide a reduced vacuum level within the dispensing vacuum chamber; and
means for loading substrates into the dispensing vacuum chamber and unloading substrates from the dispensing vacuum chamber while maintaining the reduced vacuum level within the dispensing vacuum chamber.

18. The dispensing system of claim 17, wherein the means for loading includes an inlet vacuum chamber coupled to the dispensing vacuum chamber and an outlet vacuum chamber coupled to the dispensing vacuum chamber.

19. The dispensing system of claim 18, further comprising means for transporting substrates from the inlet vacuum chamber to a dispensing position in the dispensing vacuum chamber, and means for transporting the substrates from the dispensing position to the outlet vacuum chamber.

20. The dispensing system of claim 19, further comprising means for evacuating air from the inlet vacuum chamber, and means for evacuating air from the outlet vacuum chamber.

* * * * *